(12) United States Patent
Su

(10) Patent No.: US 7,197,727 B1
(45) Date of Patent: Mar. 27, 2007

(54) INTERCONNECT SPEED SENSING CIRCUITRY

(75) Inventor: Michael Zhuoying Su, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 415 days.

(21) Appl. No.: 10/700,902

(22) Filed: Nov. 4, 2003

(51) Int. Cl.
*G06F 17/50* (2006.01)
*G06F 9/45* (2006.01)

(52) U.S. Cl. .............................................. 716/4; 716/6
(58) Field of Classification Search .................... 716/4, 716/6
See application file for complete search history.

(56) References Cited

U.S. PATENT DOCUMENTS

| | | | |
|---|---|---|---|
| 5,943,488 A * | 8/1999 | Raza ........................... | 716/19 |
| 6,207,553 B1 | 3/2001 | Buynoski et al. | |
| 6,345,209 B1 | 2/2002 | Yu | |
| 6,463,570 B1 * | 10/2002 | Dunn et al. ..................... | 716/4 |
| 6,493,851 B1 * | 12/2002 | Bach et al. ..................... | 716/4 |
| 6,553,545 B1 * | 4/2003 | Stinson et al. .................. | 716/4 |
| 6,560,567 B1 * | 5/2003 | Yechuri ........................... | 703/2 |
| 2002/0032493 A1 * | 3/2002 | Kadowaki et al. ............. | 700/97 |
| 2005/0097485 A1 * | 5/2005 | Guenthner et al. ............. | 716/6 |

OTHER PUBLICATIONS

Stopper, H "A Wafer with Electrically Programmable Interconnections", Digest of Technical papers, 1985 IEEE International Solid-State Circuits Conference, Feb. 1985, pp. 268-269.*
Neil H. E. Weste and Kamran Eshraghian, Principles of CMOS VLSI Design, A Systems Perspective, Second Edition, Addison-Wesley Publishing Co., Copyright 1993 by AT&T, pp. 191-198.
Tom Pye and Peter Rose, Low-Dielectric-Constant Materials for Back-End-of-Line Applications, Semiconductor Fabtech, 8th Edition, pp. 203-207.

* cited by examiner

*Primary Examiner*—Vuthe Siek
*Assistant Examiner*—Magid Y. Dimyan
(74) *Attorney, Agent, or Firm*—Zagorin O'Brien Graham LLP

(57) ABSTRACT

A mechanism has been developed by which the impact on speed from back end-of-line interconnect layers may be characterized. A method for designing interconnect layers of an integrated circuit includes coupling a capacitive load to a speed sensing circuit to measure a delay corresponding to an interconnect structure of an integrated circuit design, selectively configuring the capacitive load by selectively coupling at least one of a plurality of capacitive structures, the capacitive structures including at least a portion of a plurality of metal layers. The capacitive load is representative of the interconnect structure. The method includes measuring the delay corresponding to the capacitive load to characterize at least one layer of the interconnect structure. In some realizations, the method also includes characterizing the interconnect structure based at least in part on the delay measurement.

19 Claims, 8 Drawing Sheets

INTERCONNECT SPEED SENSING CIRCUITRY

BACKGROUND

1. Field of the Invention

The present invention relates generally to techniques for manufacturing integrated circuits and, in particular, to techniques for characterizing interconnect structures.

2. Description of the Related Art

Increased operating speeds and reduced power consumption of integrated circuits may be achieved by decreasing operating voltages and decreasing critical dimensions (i.e., the size of the smallest geometrical features that can be formed during semiconductor manufacturing using a given process technology). Decreased operating voltages and decreased critical dimensions increase the significance of capacitances associated with metal lines and may result in such capacitances, e.g., those associated with back end-of-line structures (i.e., structures produced by process steps for contacting devices formed on an integrated circuit) dominating circuit speed. Increasing the number of metal layers makes it difficult to measure the realized parameters for individual layers (e.g., metal layers or insulating layers) obtained from a given process. Accordingly, there is a need for a technique that efficiently and effectively quantifies the effects of capacitances, such as those formed by back end-of-line layers on circuit performance.

SUMMARY

A mechanism has been developed by which the impact on speed from interconnect layers may be characterized. In some embodiments of the invention, an integrated circuit includes a speed sensing circuit and a first capacitive load for characterizing at least one layer of an interconnect structure in the integrated circuit, the first capacitive load being selectively coupled to the speed sensing circuit. The first capacitive load is formed by at least a portion of a first metal trace residing in a first metal layer and at least a portion of a second metal trace residing in a second metal layer. The first and second metal layers are separated by at least an insulating layer. The integrated circuit may include at least a second capacitive load for characterizing at least one layer of an interconnect structure in the integrated circuit, the second capacitive load being selectively coupled to the first capacitive load. The second capacitive load is formed by at least a portion of an additional metal trace residing in an additional metal layer, the additional metal layer being separated from the first and second metal layers by at least an insulating layer.

In some embodiments of the present invention, an integrated circuit includes a speed sensing circuit and a first capacitive load for characterizing at least one layer of an interconnect structure in the integrated circuit, selectively coupled to one of the plurality of speed sensing circuits. The first capacitive load is formed by at least a portion of a first metal trace residing in a first metal layer and at least a portion of a second metal trace residing in a second metal layer, the first and second metal layers being nonadjacent metal layers. The integrated circuit may also include at least a second capacitive load for characterizing at least one layer of an interconnect structure in the integrated circuit, the second capacitive load being selectively coupled to the first capacitive load. The second capacitive load is formed by at least a portion of an additional metal trace residing in an additional metal layer, the additional metal layer being separated from the first and second metal layers by at least an insulating layer.

In some embodiments of the present invention, a method includes coupling a capacitive load to a speed sensing circuit to measure a delay corresponding to an interconnect structure of an integrated circuit design. The method includes selectively configuring the capacitive load by selectively coupling at least one of a plurality of capacitive structures. The capacitive structures include at least a portion of a plurality of metal layers, the capacitive load being representative of the interconnect structure. The method includes measuring the delay corresponding to the capacitive load to characterize at least one layer of the interconnect structure. In some realizations, the method includes selectively reconfiguring the capacitive load to be representative of a second interconnect structure of an integrated circuit design and measuring a delay corresponding to the reconfigured capacitive load to characterize at least one layer of the second interconnect structure.

In some embodiments of the present invention, a method of manufacturing an integrated circuit includes forming a speed sensing circuit and forming a first capacitive load for characterizing at least one layer of an interconnect structure in the integrated circuit, the first capacitive load being selectively coupled to the speed sensing circuit. The first capacitive load is formed by at least a portion of a first metal trace residing in a first metal layer and at least a portion of a second metal trace residing in a second metal layer. The first and second metal layers are separated by at least an insulating layer. The method may also include forming at least a second capacitive load for characterizing at least one layer of an interconnect structure in the integrated circuit, the second capacitive load being selectively coupled to the speed sensing circuit. The second capacitive load is formed by at least a portion of an additional metal trace residing in an additional metal layer. The additional metal layer is separated from the first and second metal layers by at least an insulating layer. In some realizations of the present invention, the method includes forming a selective connector selectively coupling the first and second capacitive loads to the speed sensing circuit. The metal layers may include at least one nonadjacent metal layer.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION OF THE INVENTION

Figure 1:
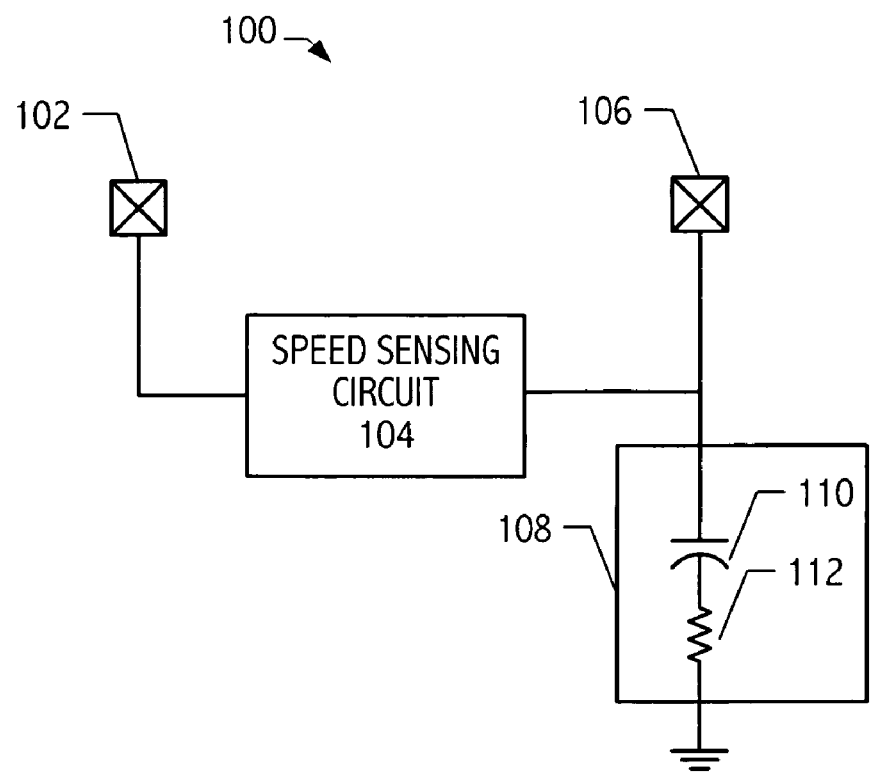
FIG. 1 is an exemplary test structure for characterizing interconnect layers in accordance with some embodiments of the present invention.
Figure 2A:
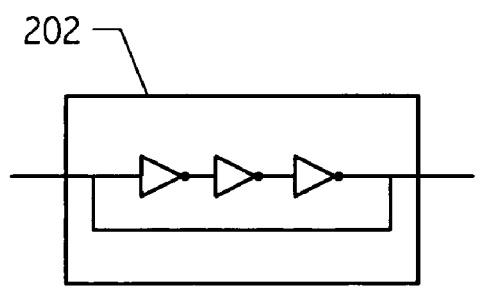
FIG. 2A is an exemplary speed sensing circuit in accordance with some embodiments of the present invention.
Figure 2B:
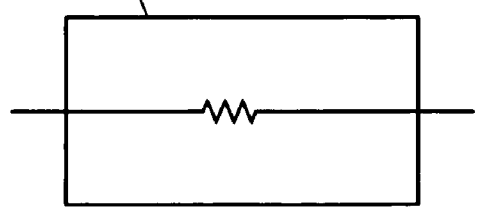
FIG. 2B is an exemplary speed sensing circuit in accordance with some embodiments of the present invention.

Referring to FIG. 1, test structure 100 includes speed sensing circuit 104 coupled to capacitive load 108. Input port 102 may be coupled to receive input signals from on or off-chip, and output port 106 may communicate output signals on or off-chip. In some realizations of the invention, speed sensing circuit 104 includes a ring oscillator, as illustrated in FIG. 2A. Ring oscillator 202 includes an odd number of inverters, but ring oscillator 202 may be any other oscillating circuit known in the art. When speed sensing circuit 104 includes a ring oscillator, speed measurements may be made by detecting changes to a frequency of oscillation corresponding to changes to capacitive load 108. Referring to FIGS. 1 and 2B, in some realizations of the invention, speed sensing circuit 104 may include resistive delay element 204. Speed measurements may be made by detecting changes to a delay of a signal through speed sensing circuit 104, corresponding to changes in capacitive load 108. In addition to including a ring oscillator and/or a resistive delay element, speed sensing circuit 104 may include any other circuit known in the art for measuring the speed of a signal. Data collection from output port 106 may include storing data in memory after selective configuration of the circuit and reading these results from memory, or by any other method for collecting data known in the art.

Figure 3A:
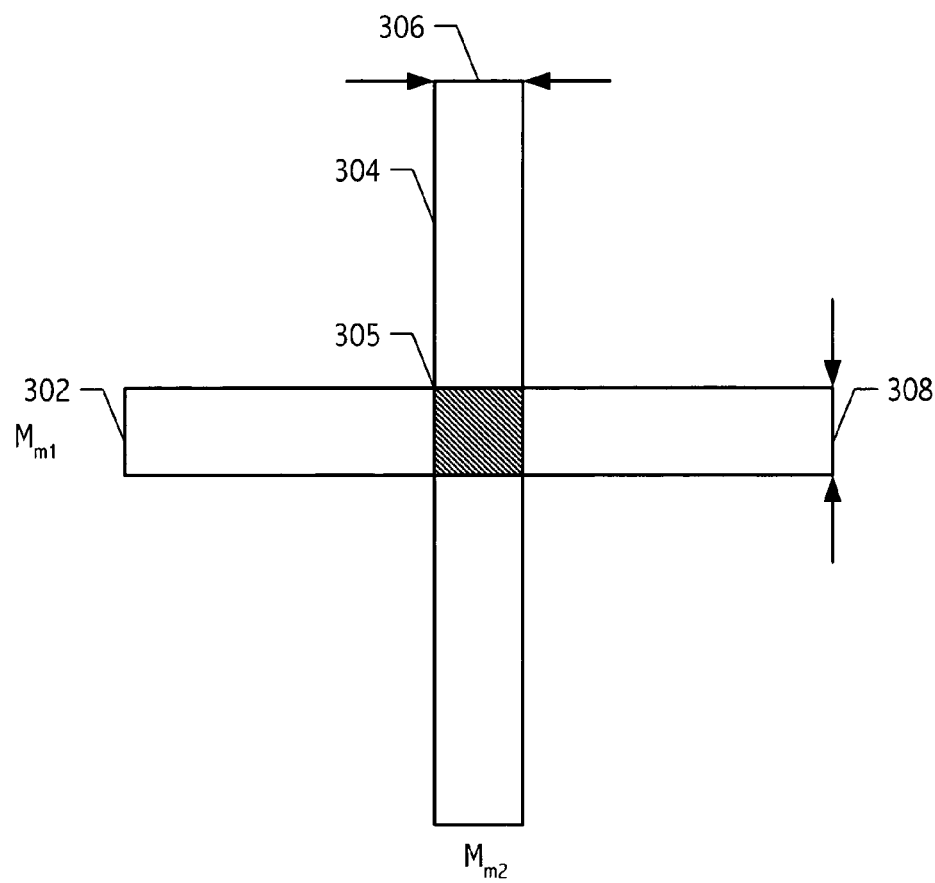
FIG. 3A is an exemplary interconnect structure in accordance with some embodiments of the present invention.
Figure 3B:
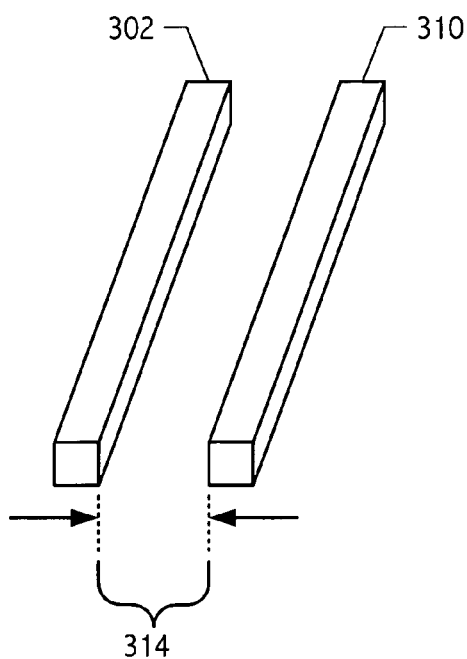
FIG. 3B is an exemplary interconnect structure in accordance with some embodiments of the present invention.

In general, an RC time constant (i.e. a delay) is associated with interconnect structures. The shaded region in FIG. 3A, overlap region 305, is the region of metal trace 302 that overlaps metal trace 304, forming a capacitive load, e.g., capacitive load 108 in FIG. 1. FIG. 3B illustrates a capacitive load including line-to-line capacitance introduced by parallel metal traces 302 and 310, separated by distance 314. Typically, the resistance of an interconnect structure depends on the resistivity, cross-sectional area, and length of the metal lines. The capacitance and the delay introduced by an interconnect structure typically depend on the distance between the lines, the dielectric constant of the insulator, the line height, and the line length, among other factors. Although the delay introduced by interconnect structures may be modeled based on target parameters, the realized process may deviate from the expected results. In order to adjust a process to improve actual results, the effects on delays that are introduced by individual layers may be quantified to identify process steps for adjustment.

Capacitive load 108 is illustrated as capacitive element 110 and resistive element 112. Capacitive element 110 and resistive element 112 are formed by interconnect layers, examples of which are illustrated in FIG. 3A and FIG. 3B. Referring to FIG. 3A, metal trace 302, resides in metal layer $M_{m1}$ and metal trace 304 resides in metal layer $M_{m2}$ where $1 \leq m1 \leq n$, $1 \leq m2 \leq n$, and n is the total number of metal layers implemented in the manufacturing process. Referring to FIG. 3B, metal trace 302 and metal trace 310 may reside in the same metal layer or in different metal layers. Metal traces 302, 304, and 310 may be formed on an integrated circuit by any method known in the art. Metal layers $M_{m1}$ and $M_{m2}$ may include aluminum, silver, copper, tungsten, or any other metal, metal alloy, or other conductive element used in integrated circuit manufacturing. Metal layers $M_{m1}$ and $M_{m2}$ are typically separated by a layer used to insulate adjacent metal lines. Metal layers $M_{m1}$ and $M_{m2}$ may be adjacent metal layers, i.e., metal layers that are separated by an insulating layer. Metal layers $M_{m1}$ and $M_{m2}$ may be nonadjacent metal layers, i.e., metal layers separated by at least an additional metal layer. The insulating layer may include materials having varying dielectric constants, including low-k (i.e., low dielectric constant or low permittivity) materials. Typically, silicon dioxide deposited by tetraethylorthosilicate (TEOS) decomposition is used as an insulating layer. In an exemplary process, low-k interlayer dielectrics i.e., dielectric materials having a dielectric constant lower than, e.g., 3.9, the dielectric constant of thermally grown $SiO_2$, are used to insulate adjacent metal layers. Decreasing the dielectric constant typically reduces the capacitive coupling between metal lines.

Referring back to FIG. 1, capacitive load 108 is generally designed to represent particular process layers and/or design rules. For example, in FIG. 3A, metal trace 302 has a line width 306 and metal trace 304 has a line width 308. These line widths may be set to the critical dimension of the metal layer (i.e., a minimum line width), a nominal line width (i.e., an average line width), or to a maximum line width that may be formed in the particular metal layer and achievable in a particular process technology. Similarly, the thickness of the metal layers including metal traces 302 and 304 and the dielectric layer(s) separating the metal layers may be varied with achievable values in a particular process technology. In addition, the density, i.e., the spacing relationship between a metal trace and adjacent metal traces, as illustrated in FIG. 3B, may be set to a minimum density, nominal density, or a maximum density achievable in a particular process technology. In some realizations, the process corners for the dielectric constant may also be varied across different instances of capacitive load 108 to isolate the effects of these process parameters on interconnect delay. The achievable parameters, e.g., line widths, metal thickness, line density, and dielectric constant of insulators, typically vary with variations in process technology.

Figure 4:
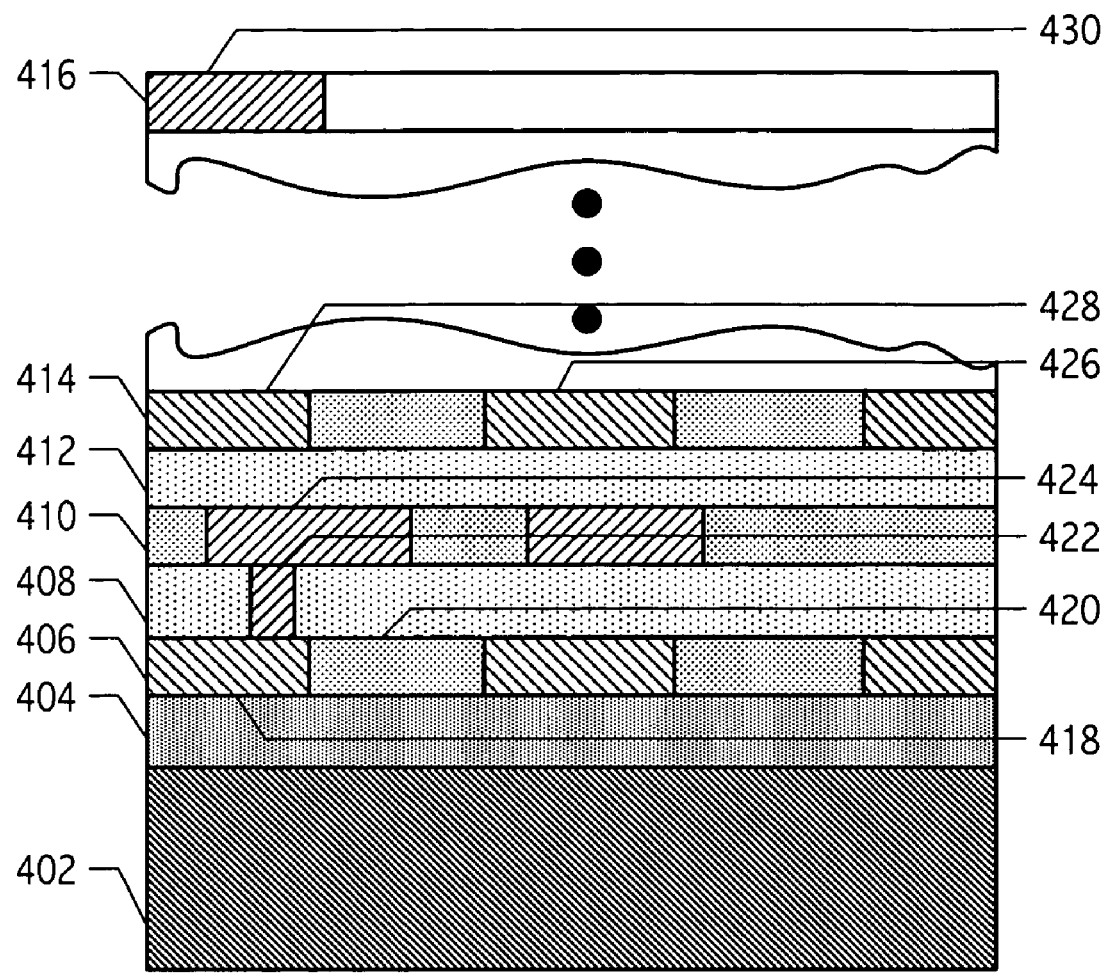
FIG. 4 is an exemplary cross-section of interconnect structures in accordance with some embodiments of the present invention.

A cross-sectional view of portions of interconnect structures is illustrated in FIG. 4. Layer 404 represents an insulator layer and transistor structures formed on semiconductor substrate 402. First metal layer 406 includes metal traces, e.g., metal trace 418, as indicated by the diagonal hash lines, separated by an insulating material, e.g., material 420. Insulating layer 408 separates second metal layer 410 from an adjacent metal layer, first metal layer 406. Via 422 is formed in insulating layer 408 to electrically couple metal trace 424 to metal trace 418. Insulating layer 412 separates second metal layer 410 from third metal layer 414. Metal trace 428 is formed in third metal layer 414 and may be capacitively coupled to traces in adjacent metal layer 410, e.g., metal trace 424, as well as to traces in non-adjacent layers, e.g., metal trace 430 in nth metal layer 416. Capacitive coupling of varying degrees may be present between any of the n metal layers formed on the integrated circuit. In addition, capacitive coupling may be present between metal traces residing in a single metal layer, e.g., between metal traces 426 and 428. Information regarding the effects on delays introduced by each layer may be useful in determining signal routing as well as adjusting delays resulting from interconnect layer process parameters.

Figure 5:
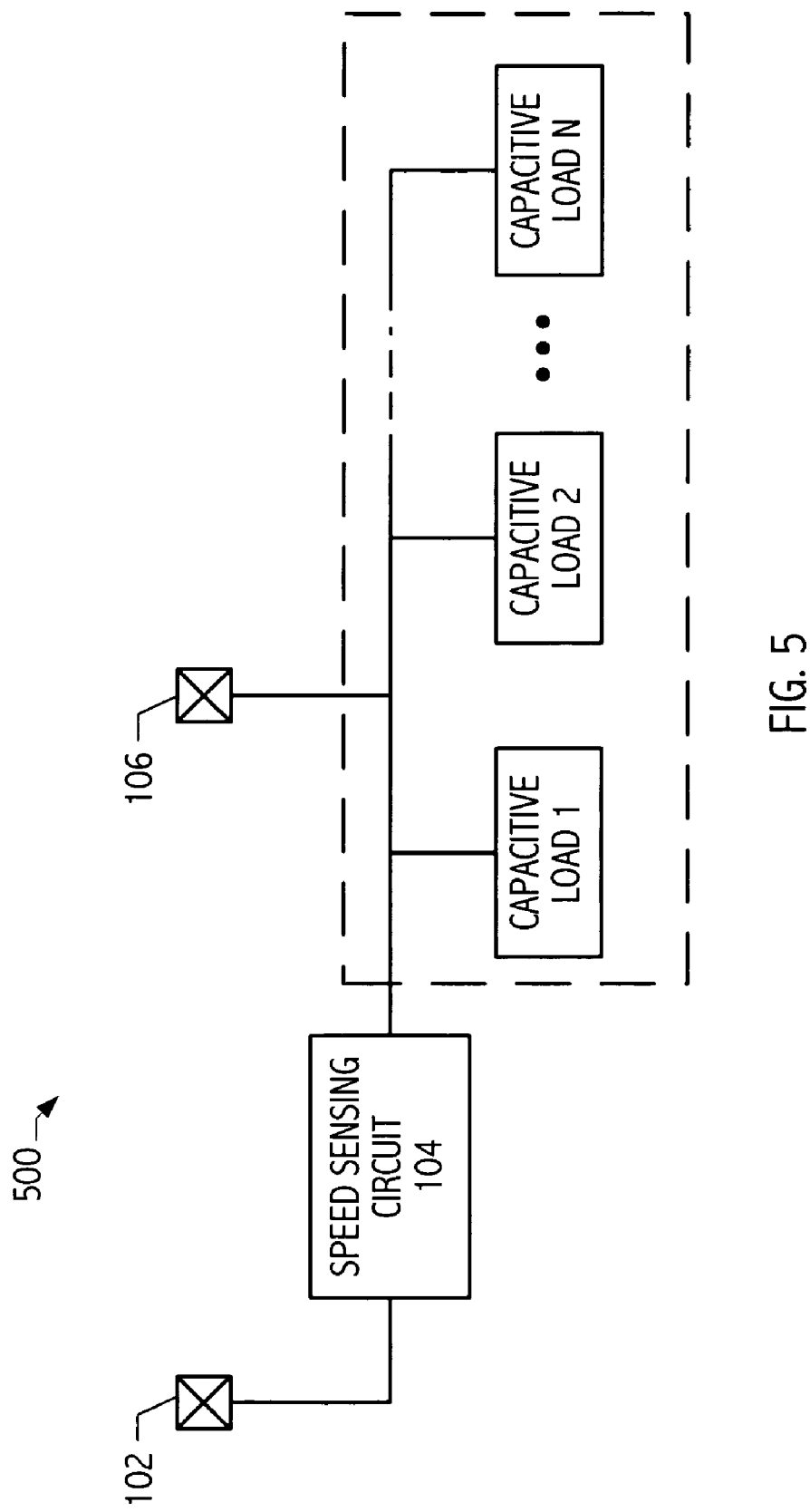
FIG. 5 is an exemplary test structure for characterizing interconnect layers in accordance with some embodiments of the present invention.

Referring to FIG. 5, circuit 500 includes an exemplary test structure for measuring the cumulative effects of multiple interconnect layers on circuit speed. Speed sensing circuit 104 is coupled to capacitive loads 1 through N. Capacitive loads 1 through N include structures formed by overlapping regions of individual ones of traces formed in n metal layers, as described above. During manufacturing of the integrated circuit, after each metal layer is added, a test signal may be supplied to port 102 and the delay determined from a signal received from output port 106. Thus, a measurement may be obtained for capacitive contributions introduced by the addition of each metal layer. However, measurements acquired in this manner may not be representative of the capacitive contributions realized in a completed product.

Figure 6:
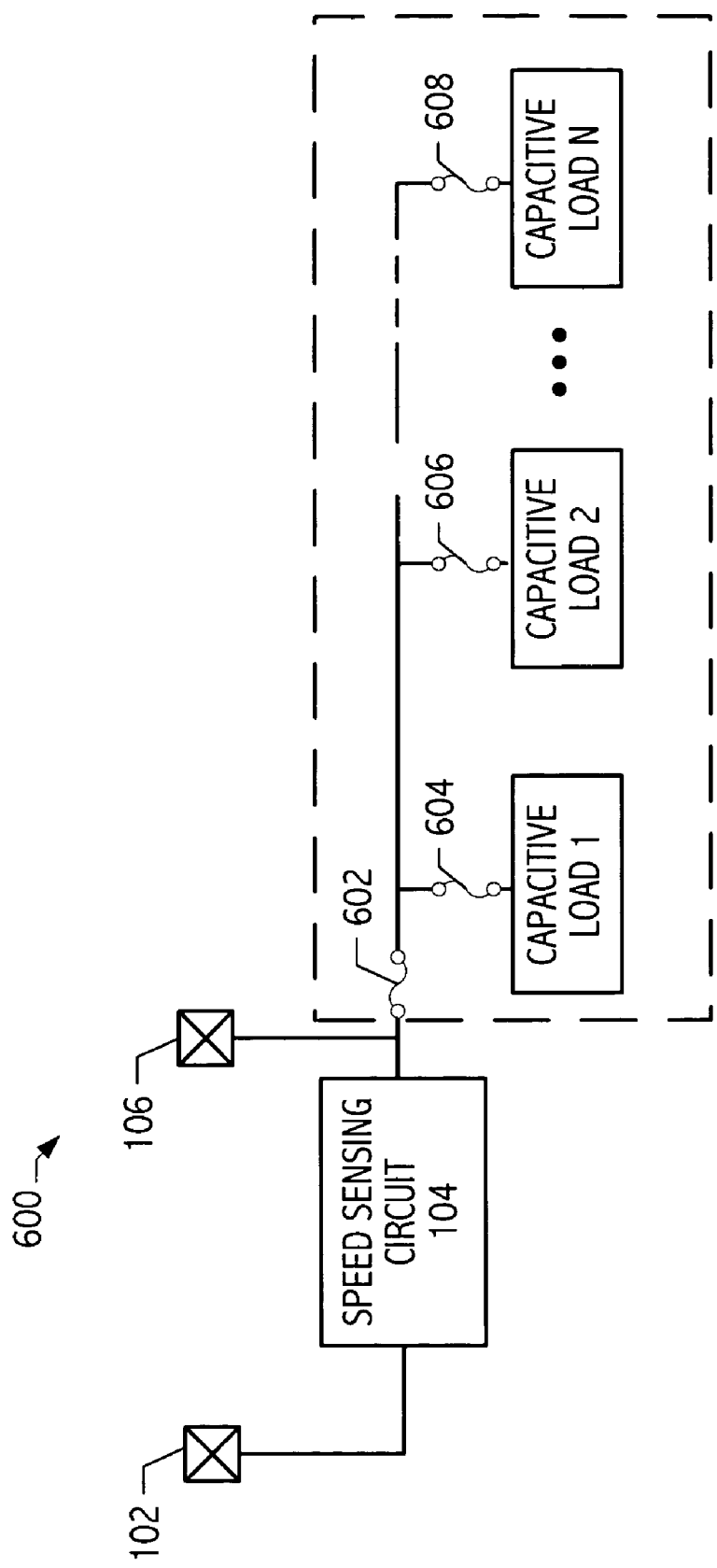
FIG. 6 is an exemplary test structure for characterizing interconnect layers in accordance with some embodiments of the present invention.

Instead of testing the circuit after forming each metal layer, similar data may be obtained after completing the back-end-of-line process by coupling individual loads to various instances of speed sensing circuit 104. Alternatively, a single instance of speed sensing circuit 104 may be coupled to a selectively configurable capacitive load, an exemplary embodiment of which is illustrated in FIG. 6. Test circuit 600 includes selective connectors 602–08, which effectively introduce an open circuit or a short circuit between speed sensing circuit 104 and ones of capacitive loads 1 through N. Selective connectors 602–08 may be fuses, anti-fuses, or any other suitable connecting device. A particular configuration is typically selected by electrically enabling or disabling a selective connector. Examples of selective connectors include, but are not limited to, fuses blown by laser, implanted polysilicon resistors that may be activated or deactivated with a voltage or current, or logic circuitry, i.e., circuits including programmable logic devices (PLDs).

Figure 7:
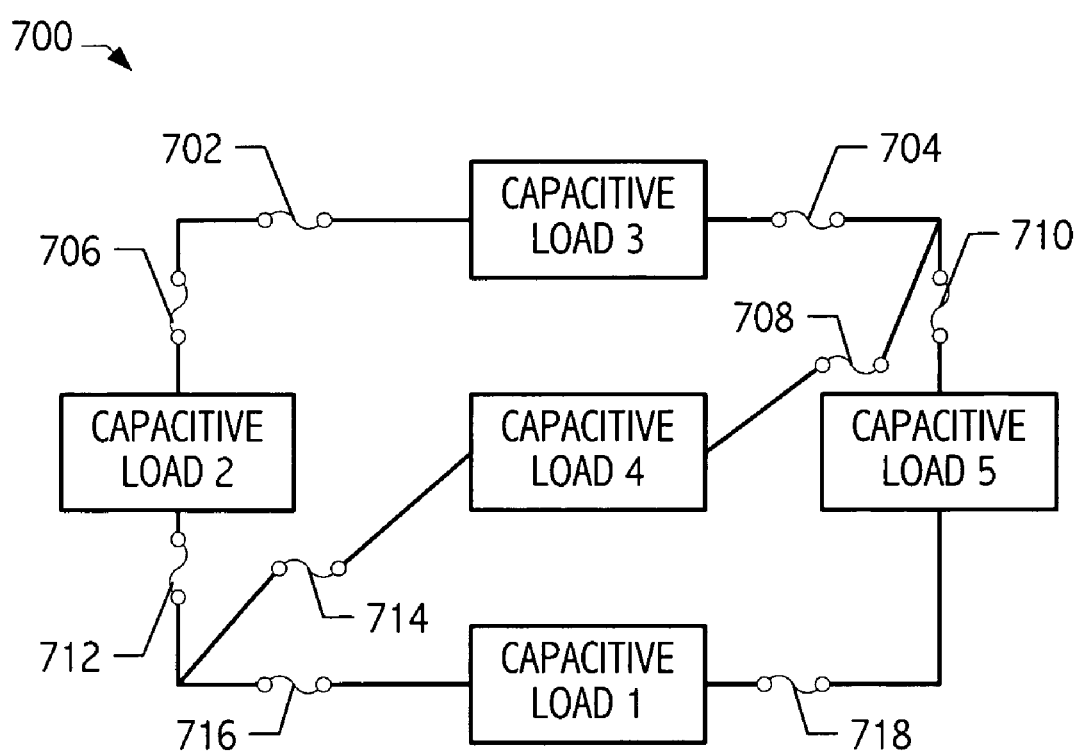
FIG. 7 is an exemplary test structure for characterizing interconnect layers in accordance with some embodiments of the present invention.

Selective connectors 602–08 may be configured post-processing to obtain delay measurements for a variety of configurations. In general, a variable number of capacitive loads, represented by capacitive loads 1 through 5 of circuit 700 in FIG. 7, may be formed on an integrated circuit coupled to selective connectors, e.g. selective connectors 702–18. Individual ones of capacitive loads 1 through N may be selectively coupled in series or in parallel to other capacitive loads for strategically forming test structures representative of particular design rules.

Figure 8:
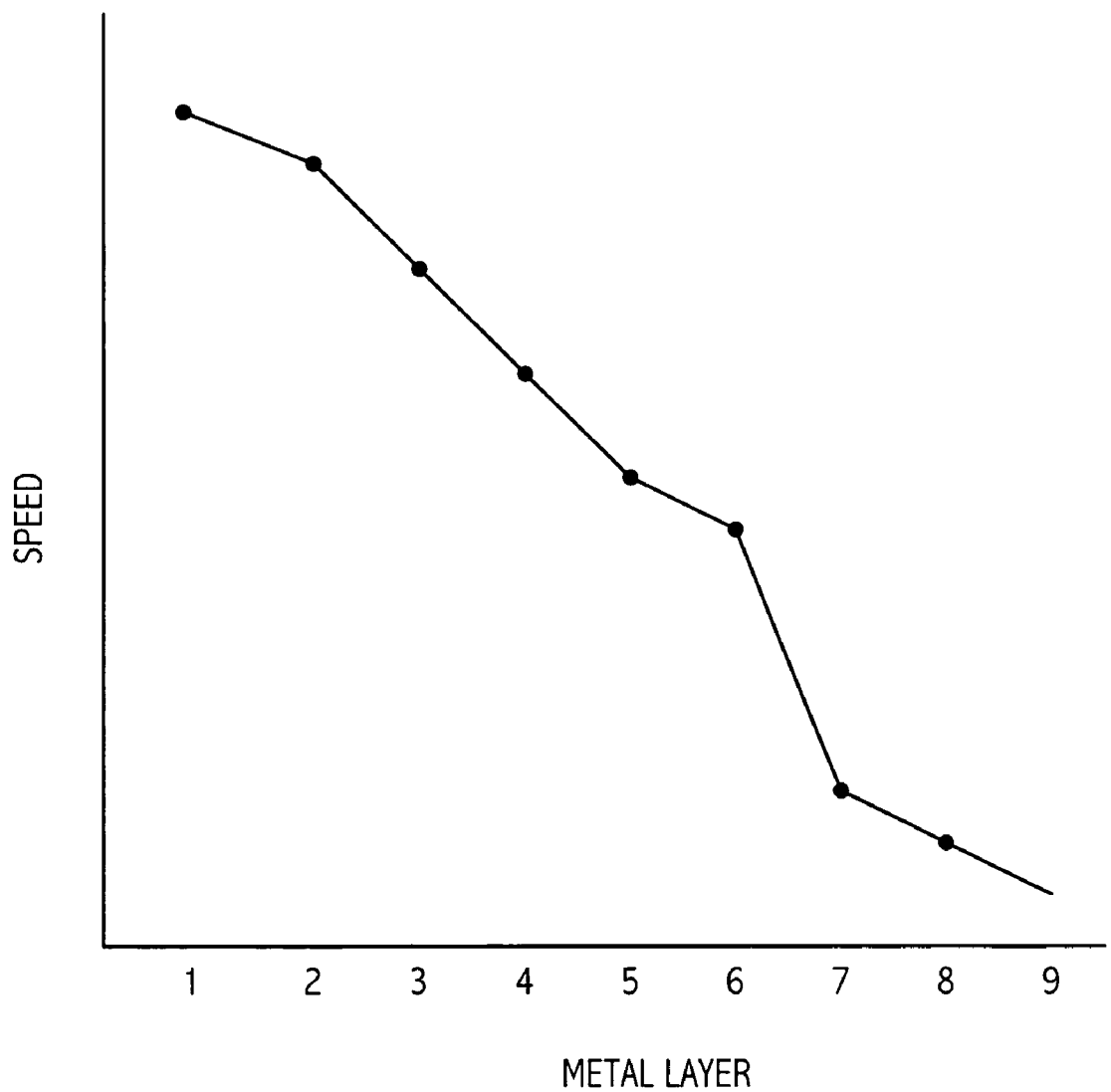
FIG. 8 illustrates exemplary speed measurements for metal layers of an interconnect structure in accordance with some embodiments of the present invention.

One technique for characterizing interconnect layers decouples all of the capacitive loads from speed sensing circuit 104, so that speed sensing circuit 104 itself may be characterized. Speed sensing circuit 104 may be characterized by measuring the delay through speed sensing circuit 104 or determining the frequency of oscillation of unloaded speed sensing circuit 104 as may be appropriate for a particular design of speed sensing circuit 104. If all N capacitive loads are selectively coupled to speed sensing circuit 104, a cumulative effect for all interconnect layers may be measured. By selectively decoupling an nth capacitive load, which in one realization includes a capacitive structure formed from the nth metal layer, a cumulative effect of the first n−1 metal layers may be measured. Repeated measurements of the first 1 through k capacitive loads for $0 \leq k \leq N$, will result in speed measurements of data indicative of cumulative contributions for all n metal layers, as illustrated in FIG. 8.

Figure 9:
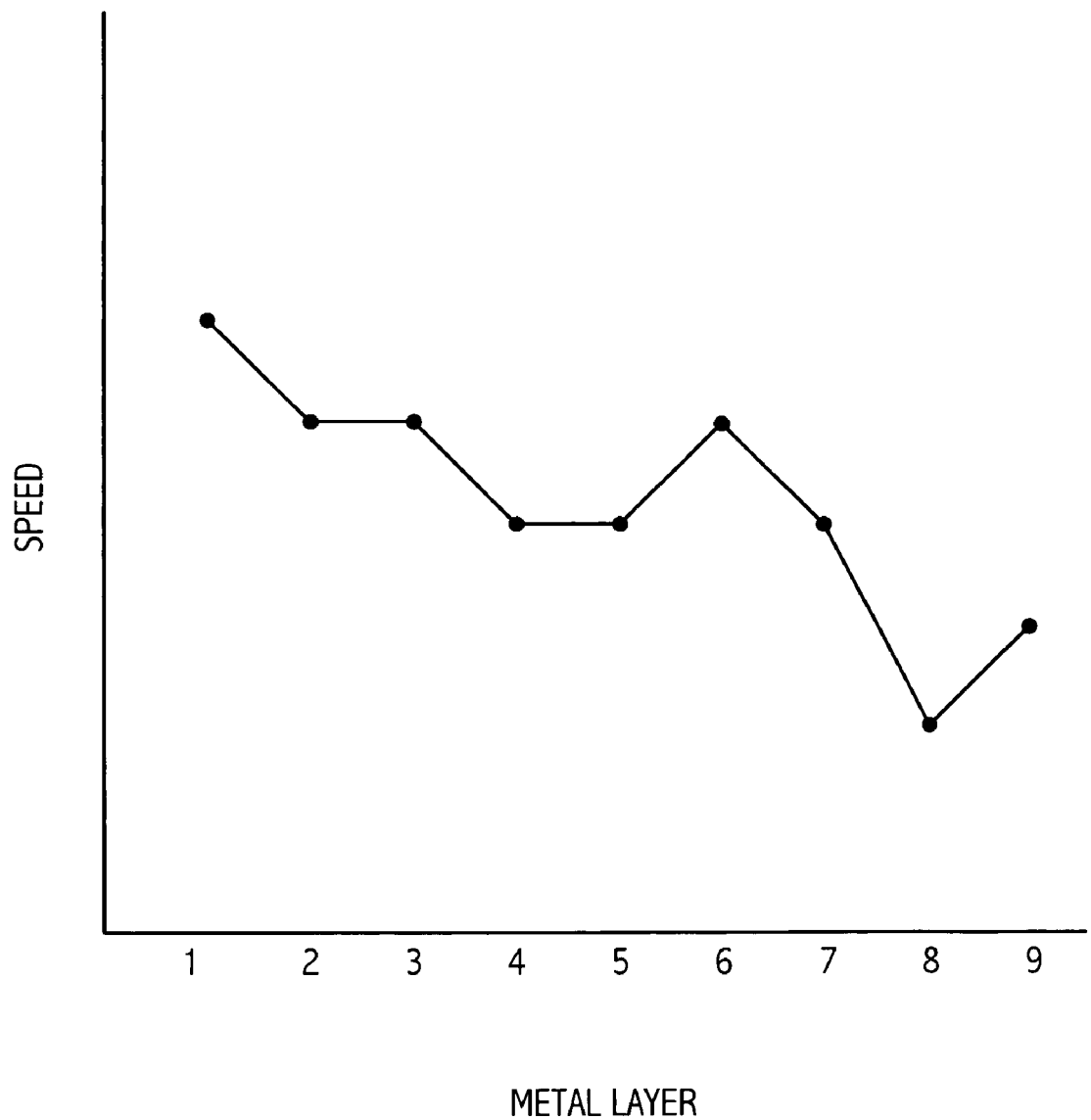
FIG. 9 illustrates exemplary speed measurements for metal layers of an interconnect structure in accordance with some embodiments of the present invention.

Delay contributions attributable to individual ones of the n metal layers may be determined from measurements of capacitive loads representing contributions of the individual metal layers, as illustrated in FIG. 9. These data may be used to determine which layers dominate interconnect delay. For example, in FIG. 9, metal layer 1 is faster than remaining layers 2 through 9 and metal layer 8 is slower than metal layers 1 through 7 and slower than 9. This information may be useful for adjusting process parameters e.g., metal line widths, dielectric constants, etc.

The description of the invention set forth herein is illustrative, and is not intended to limit the scope of the invention as set forth in the following claims. For example, while specific speed sensing circuits have been described, the individual components may vary. Other variations and modifications of the embodiments disclosed herein, may be made based on the description set forth herein, without departing from the scope and spirit of the invention as set forth in the following claims.

What is claimed is:

1. An integrated circuit comprising:
   a speed sensing circuit; and
   a first capacitive load for characterizing at least one layer of an interconnect structure in the integrated circuit, the first capacitive load being selectively coupled to the speed sensing circuit, the first capacitive load being formed by at least a portion of a first metal trace residing in a first metal layer and at least a portion of a second metal trace residing in a second metal layer, the first and second metal layers being separated by at least an insulating layer.

2. The integrated circuit, as recited in claim 1, further comprising:
   at least a second capacitive load for characterizing at least one layer of an interconnect structure in the integrated circuit, the second capacitive load being selectively coupled to the first capacitive load, the second capacitive load being formed by at least a portion of an additional metal trace residing in an additional metal layer, the additional metal layer being separated from the first and second metal layers by at least an insulating layer.

3. The integrated circuit, as recited in claim 1, wherein the first and second metal layers are nonadjacent metal layers.

4. The integrated circuit, as recited in claim 1, wherein at least one of the metal traces has a minimum dimension.

5. The integrated circuit, as recited in claim 1, wherein at least one of the metal traces has a maximum dimension.

6. The integrated circuit, as recited in claim 1, wherein at least one of the metal traces has a nominal dimension.

7. The integrated circuit, as recited in claim 1, wherein at least one of the metal traces is formed as one of a plurality of metal traces having a minimum density.

8. The integrated circuit, as recited in claim 1, wherein at least one of the metal traces is formed as one of a plurality of metal traces having a maximum density.

9. The integrated circuit, as recited in claim 1, wherein at least one of the metal traces is formed as one of a plurality of metal traces having a nominal density.

10. The integrated circuit, as recited in claim 1, wherein the insulating layer has a low dielectric constant (low-k).

11. The integrated circuit, as recited in claim 1, wherein the speed sensing circuit includes a ring oscillator.

12. The integrated circuit, as recited in claim 1, wherein the speed sensing circuit includes a resistor.

13. The integrated circuit, as recited in claim 2, wherein the first and second capacitive loads are coupled in series.

14. The integrated circuit, as recited in claim 2, wherein the first and second capacitive loads are coupled in parallel.

15. The integrated circuit, as recited in claim 2, further comprising:
a selective connector selectively coupling at least one of the first and second capacitive loads to the speed sensing circuit.

16. The integrated circuit, as recited in claim 15, wherein the selective connector includes a fuse.

17. The integrated circuit, as recited in claim 15, wherein the selective connector includes an anti-fuse.

18. An integrated circuit comprising:
a speed sensing circuit; and
a first capacitive load for characterizing at least one layer of an interconnect structure in the integrated circuit, the first capacitive load being selectively coupled to the speed sensing circuit, the first capacitive load being formed by at least a portion of a first metal trace residing in a first metal layer and at least a portion of a second metal trace residing in a second metal layer, the first and second metal layers being nonadjacent metal layers.

19. The integrated circuit, as recited in claim 18, further comprising:
at least a second capacitive load for characterizing at least one layer of an interconnect structure in the integrated circuit, the second capacitive load being selectively coupled to the first capacitive load, the second capacitive load being formed by at least a portion of an additional metal trace residing in an additional metal layer, the additional metal layer being separated from the first and second metal layers by at least an insulating layer.

* * * * *